US006729776B2

United States Patent
O'Connor et al.

(10) Patent No.: US 6,729,776 B2
(45) Date of Patent: May 4, 2004

(54) TRANSPARENT SUBSTRATE AND HINGED OPTICAL ASSEMBLY

(75) Inventors: Gary O'Connor, Bolingbrook, IL (US); Randy Wickman, Cadott, WI (US); John Greene, Chippewa Falls, WI (US); Daniel Mansur, Chippewa Falls, WI (US); Dave Barneson, Eleva, WI (US); Bryan Gregory, Glen Ellyn, IL (US)

(73) Assignee: Corona Optical Systems, Inc., Lombard, IL (US)

( * ) Notice: Subject to any disclaimer, the term of this patent is extended or adjusted under 35 U.S.C. 154(b) by 0 days.

(21) Appl. No.: 10/219,749

(22) Filed: Aug. 15, 2002

(65) Prior Publication Data

US 2002/0197024 A1 Dec. 26, 2002

Related U.S. Application Data

(62) Division of application No. 09/951,646, filed on Sep. 13, 2001, now Pat. No. 6,450,704.
(60) Provisional application No. 60/239,058, filed on Oct. 5, 2000.

(51) Int. Cl.$^7$ ................................................. G02B 6/36
(52) U.S. Cl. .......................................... 385/92; 385/88
(58) Field of Search ............................... 385/92, 90, 88, 385/89, 93, 91

(56) References Cited

U.S. PATENT DOCUMENTS

| | | | | |
|---|---|---|---|---|
| 5,590,232 A | * | 12/1996 | Wentworth et al. | ........... 385/92 |
| 5,625,734 A | * | 4/1997 | Thomas et al. | ............... 385/88 |
| 5,768,456 A | * | 6/1998 | Knapp et al. | ................. 385/49 |
| 6,056,448 A | * | 5/2000 | Sauter et al. | ................. 385/92 |
| 6,234,687 B1 | * | 5/2001 | Hall et al. | ..................... 385/88 |
| 6,318,909 B1 | * | 11/2001 | Giboney et al. | ............. 385/90 |
| 6,450,704 B1 | * | 9/2002 | O'Connor et al. | ............ 385/92 |

* cited by examiner

Primary Examiner—Ellen E. Kim
(74) Attorney, Agent, or Firm—Welsh & Katz, Ltd.

(57) ABSTRACT

A method and apparatus are provided for providing an electro-optic signal processing assembly. The method includes the steps of providing an optically transparent substrate with a plurality of alignment apertures formed in the substrate, disposing a guide pin in each of the plurality of alignment apertures, providing an optical device with a transmission path of the optical device passing directly through the body of the optically transparent substrate, aligning an optical fiber holder to the optical device using the guide pins and guide pin apertures, and coupling an optical signal of the optical device of the optical array to a respective optical fiber of the aligned optical fiber holder.

22 Claims, 8 Drawing Sheets

TRANSPARENT SUBSTRATE AND HINGED OPTICAL ASSEMBLY

CROSS REFERENCE TO RELATED APPLICATIONS

This application is a divisional patent application of Ser. No. 09/951,646 now U.S. Pat. No. 6,450,704 filed on Sep. 13, 2001 which is a continuation-in-part of U.S. Provisional Application No. 60/239,058 filed Oct. 5, 2000 (now abandoned).

FIELD OF THE INVENTION

This invention relates, in general, to fabrication of optical devices and, more particularly, to interconnecting optical devices and optical fibers.

BACKGROUND OF THE INVENTION

The coupling of an optical device or array of optical devices, an optical fiber or array of optical fibers, and an interconnecting substrate can be a difficult task. Usually the coupling is done manually or semi manually and can incur several problems such as being complex, inefficient, and not suitable for high volume manufacturing.

In order to reduce electrical parasitics, short electronic interconnects are needed between semiconductor photonic devices such as lasers and photodiodes and electronic interface circuitry. This electronic circuitry may include photonic signal drivers and photonic signal receivers. The need for decreased distance between photonic devices and electrical interface circuitry increases as the signaling data rate increases. Photonic components are often placed on simple carrier substrates to verify operation, to do burn-in, or simply to facilitate handling of that device. This photonic device and carrier substrate are then placed on another substrate and additional packaging is completed. This packaging adds additional electrical interfaces, such as wire bonds and long non-controlled impedance wires, decreasing the electrical performance of the photonic device.

In order to reduce optical losses and parasitics, efficient coupling of optical signals is needed. As optical signals tend to diverge from their original transmission axis, coupling devices or waveguides must be proximate optical transmitting and receiving devices. Signal loss increases with increased distances from an optical port to an optical connector, unless light is adequately directed through a coupling device. One example of a setup with limitations because of increased distance between the optical device and optical fiber is an electro-optic TO can with an optical port. After placing the optical component in a can and making electrical wire bonds, further packaging must be done in the alignment with a fiber optic cable. The distance between the optical device and the fiber is often relatively large, minimizing or eliminating the possibility of multiple optical devices on the same semiconductor substrate. With increased distances between a waveguide and multiple optical devices disposed on the same semiconductor, optical cross talk can reduce signal integrity.

Some prior art devices have reduced the length of electrical and/or optical interconnects by placing multiple components on a common, flexible substrate. Other prior art references teach of the use of lensing systems to guide light appropriately, thus allowing multiple optical devices on the same semiconductor while minimizing optical losses. Yet, lensing may require multiple optical couplings which can lead to signal loss. In addition, multiple waveguides require additional steps in aligning optical signals with an external optical waveguides and connectors, thus increasing manufacturing costs and decreasing yield.

Commonly used vertical cavity surface emitting laser (VCSEL) structures and photodiode structures have both electrical contacts and optical ports on the same surface of the semiconductor, creating packaging problems when trying to optimize the performance of each of these interfaces. These packaging problems are exacerbated when the optical components have arrays of optical devices. A novel packaging technique is described below under illustrated embodiments of the invention that combines complex electrical and optical trace patterns, and simplifies packaging by using a common transparent substrate. This transparent photonic circuit board could support arrays of photonic chips and electrical interface circuitry while reducing electrical losses, optical losses, and manufacturing costs.

SUMMARY OF THE INVENTION

A method and apparatus are provided for providing an electro-optic signal processing assembly. The method includes the steps of providing an optically transparent substrate with a plurality of alignment apertures formed in the substrate, disposing a guide pin in each of the plurality of alignment apertures, providing an optical device with a transmission path of the optical device passing directly through the body of the optically transparent substrate, aligning an optical fiber holder to the optical device using the guide pins and guide pin apertures, and coupling an optical signal of the optical device of the optical array to a respective optical fiber of the aligned optical fiber holder.

DETAILED DESCRIPTION OF A PREFERRED EMBODIMENT OF THE INVENTION

Figure 1:
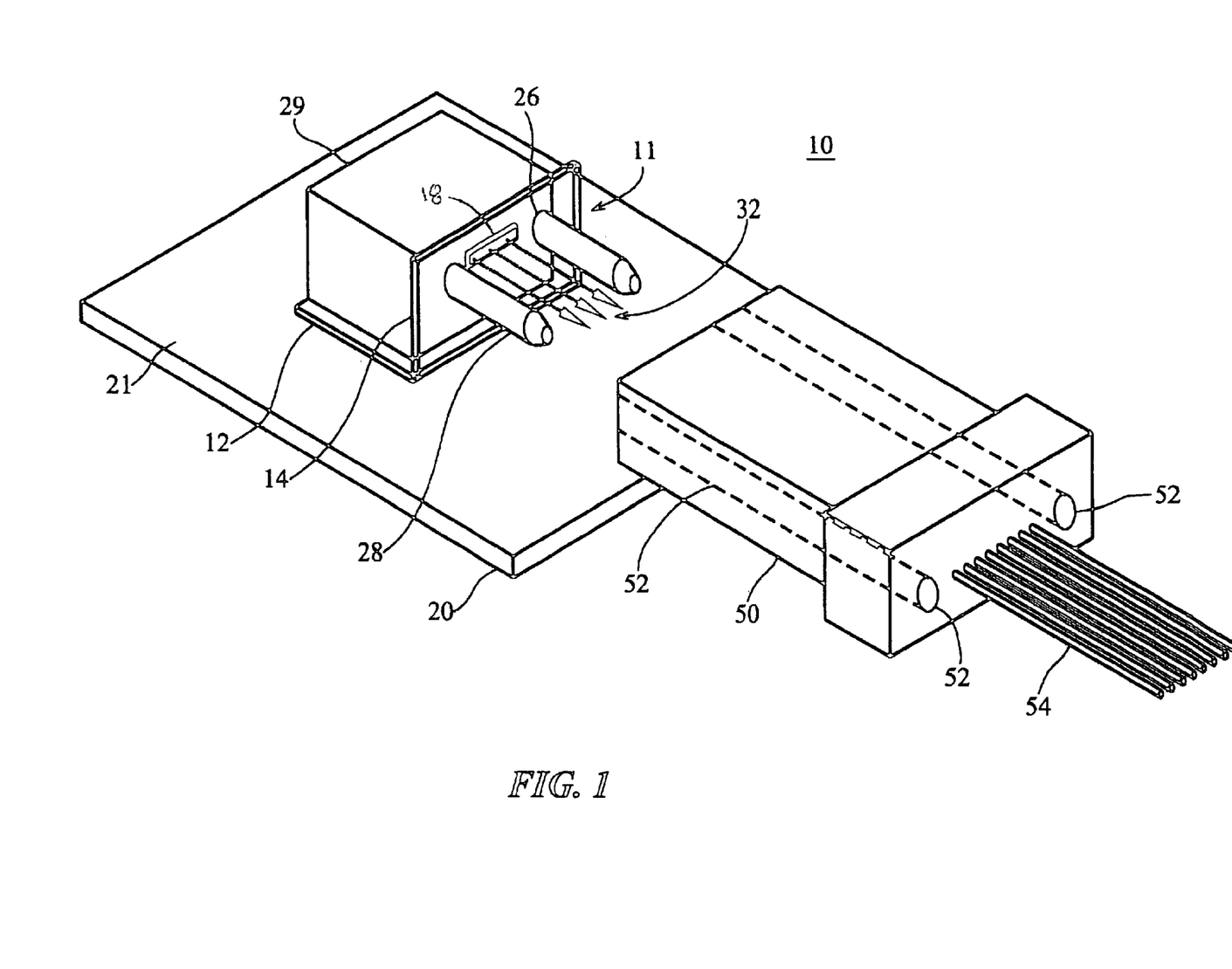
FIG. 1 illustrates a perspective view of an electro-optic communications device in accordance with an illustrated embodiment of the invention, in a context of use.

FIG. 1 illustrates an electro-optic communications assembly 10 in a context of use, according to a preferred embodiment of the invention. Included in the communications assembly 10 may be a printed circuit board 20, optically transparent, relatively rigid substrate 11 with a right angle bend, and an alignment mechanism 50 for holding optical fibers 54 in alignment with an active optical device 18. The printed circuit board 20 may be any suitable material such as FR4, ceramic interconnect, or the like. The printed circuit board 20 may have a plurality of electrical and optical devices for signal processing, as well as electrical traces and electrical pads (not shown in the figures). The optically transparent substrate 11 may comprise glass or a glass-like structure having desirable optical and structural properties. The optically transparent substrate 11 may be divided into an upright portion and a horizontal portion. A second surface 86 of the horizontal portion of the substrate 11 may be attached to a first surface of the printed circuit board 20 as shown in FIG. 1. A method for attaching may include use of a conductive adhesive or similar material.

Figure 2:
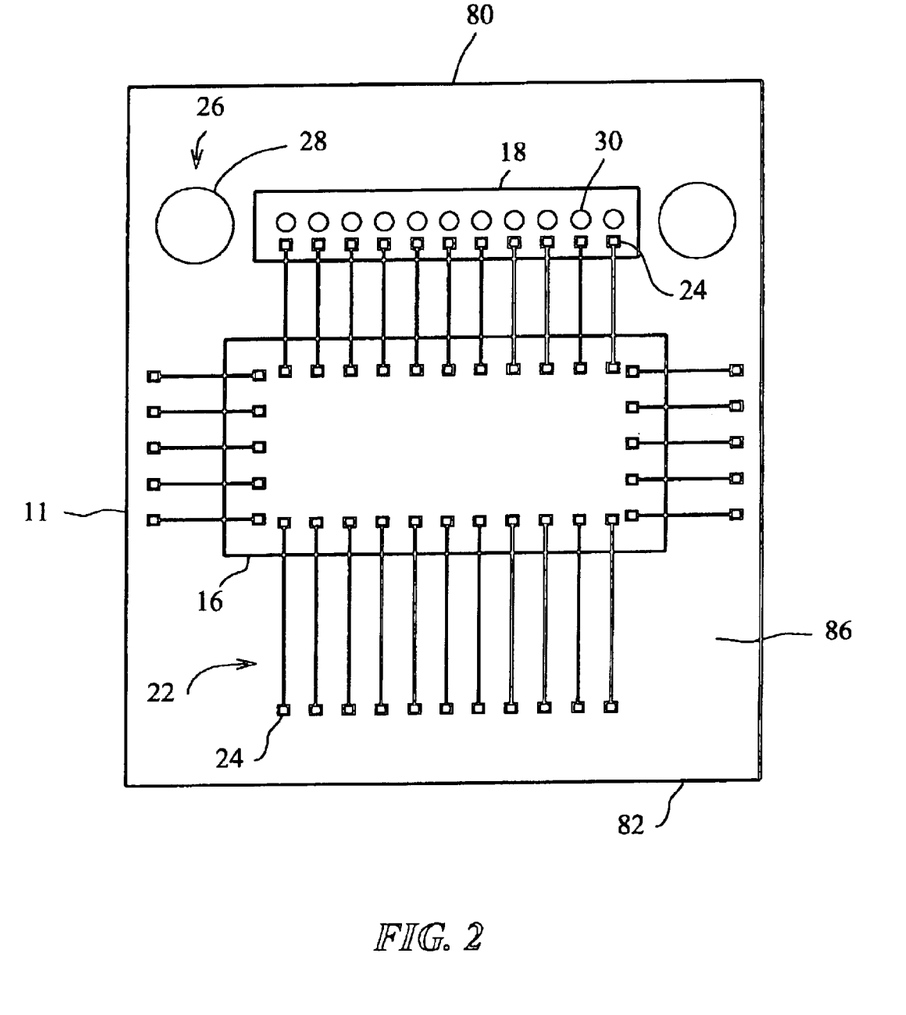
FIG. 2 illustrates a bottom view of an optically transparent substrate with corresponding features and components on the substrate.
Figure 3:
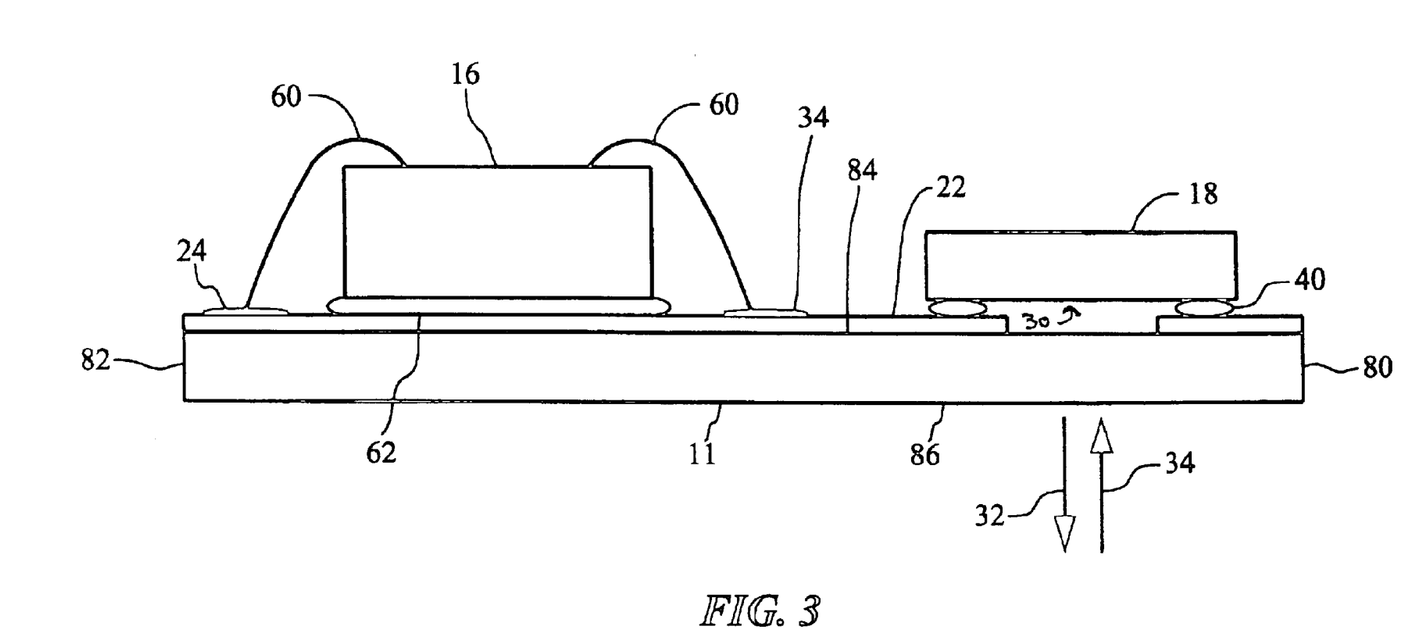
FIG. 3 illustrates a side view of an optically transparent substrate with corresponding features and components on the substrate.

FIG. 2 illustrates a bottom view of a planarized optically transparent substrate 11. The substrate 11 may include the active optical device 18, a signal processor 16, electrical traces 22, and electrical pads 24. It will be understood that the active optical device 18 can be any suitable photonic device or array of photonic devices including photo-transmitters, photo-receivers, or a combination thereof. A photo-transmitter can be any suitable device such as a vertical cavity surface emitting laser (VCSEL), light emitting diode (LED), or the like. Furthermore, any suitable photo-receiving device can be used, such as a photodiode, i.e., P-I-N diode, PN diode, or the like. Thus, the active optical device 18 can be a broad range of photoactive devices with transmitting and receiving capabilities. Each optical array may have a number of optical ports 30 for coupling optical signals to a respective photoactive device. The optical ports 30 define the optically active surfaces of the optical device 18. The optical ports 30 provide an optical transmission path to photonics transmitters, receivers, or a combination of transmitters and receivers. The transmission paths 32 and 34 of the optical device 18 may pass directly through the substrate 11 to which the device 18 is attached, as shown in FIG. 3. In the view shown in FIG. 2, the transmission paths could be normal to the substrate 11 (i.e., transmitting out of the page).

The substrate 11 may also comprise a signal processor 16. The signal processor 16 may be an amplifier mechanically attached to the substrate 11 by a conductive adhesive, solder bumps, or similar bonding technique. The signal processor 16 may be electrically connected to the active optical device 18 by stud/solder bumps with corresponding electrical traces 22 that may traverse the length of the substrate 11. Electrical traces 22 may be defined on the substrate 11 by conventional photolithographic etching processing, or a by any similar process. The substrate 11 may also have electrical traces 22 and electrical pads 24 for electrically interconnecting components that are a combination of those attached and those not attached to the substrate 11. For example, wire bonds 60, (shown in FIG. 3), may be disposed between electrical pads 24 on the substrate 11 and nearby opto-electric components, or to the printed circuit board 20.

Alignment apertures 26 (FIG. 2) may also be provided on the substrate 11. To properly align the optical ports 30 of the optical array 18 to the optical fibers 54 of the fiber holding alignment mechanism 50, alignment apertures 26 are formed in the substrate 11. The apertures 26 passing through the substrate 11 may be disposed on opposing sides of the optical array 18, precisely positioned relative to the optical array 18 proximate a first edge 80 of the substrate 11.

Alignment apertures 26 may be formed using conventional techniques such as laser ablation, chemical etching, plasma etching, or a similar process. Alignment pins 28 may be inserted concurrently through the apertures 26 formed in the substrate 11 and into apertures 52 formed on a first surface 56 of the fiber holding alignment mechanism 50, thereby aligning the optically transparent substrate 11 and optical array 18 with the fiber holding alignment mechanism 50 and its respective optical fibers 54. In a preferred embodiment of the invention, the fiber holding alignment mechanism 50 could be a standard MT connector manufactured by US Conec or Nippon Telephone & Telegraph (US Conec Part number MTF-12MM7).

The alignment pins 28 aligning the optical array 18 to the fiber holding alignment mechanism 50 may be held in place by an alignment pin holder 29. The pin holder 29 may be located proximate the first surface 84 of the substrate 11, opposite the fiber holding alignment mechanism 50. The pin holder 29 (shown in FIG. 1) may be attached to the electrical IC 16. The electrical IC 16 is shown, in FIG. 8b, attached to the substrate 11 by a conductive adhesive 62, or similar material. The guide pins 28 may be attached to the pin holder 29 by an adhesive, or the pins 28 and holder 29 could be formed by a conventional insert molding or compression fit process.

FIG. 3 illustrates a side view in an embodiment of the invention. Here the electrical IC 16 is shown electrically connected to the substrate 11 by means of wire bonds 60. The wire bonds 60 may be attached to electrical pads 24, which may be attached to electrical traces 22, which may be attached to the substrate 11. It is understood that the electrical IC can be electrically connected to the substrate 11 by additional means such as solder or stud bumps. The optical IC 18 can also be electrically connected to the substrate 11 by means of wire bonds, stud bumps, solder bumps, or any other similar electrical attachment method.

Also shown in FIG. 3 is the optical transmission axis 32 and 34. The optical device 18 could be a transmitting device, and light would propagate from the device 18 and travel through the substrate 11 in the direction 32 shown. The optical device 18 could be a receiving device, and light coming in the direction of the arrow 34 would pass through the substrate 11 and strike the receiving device 18. In either case, optical energy 32 and 34 would pass directly through the optically transparent substrate 11. In an embodiment of the invention shown in FIG. 3 using an example of a laser for the optical array 18, light must propagate 32 through the substrate 11 and away from or at least parallel to the planar surface 21 to which the substrate 11 is attached. Otherwise, if the substrate 11 did not have the right-angle bend as shown in FIG. 1, then light would strike the surface the top surface 21 of the PCB 20, the surface to which the substrate 11 is mounted to, and not enter a waveguide 50. Yet, if the portion of the substrate 11 having optical energy paths 32 and 34 was not in direct contact with the PCB 20, a waveguide could then be placed proximate the opposing surface 86 of the substrate 11.

Figure 4:
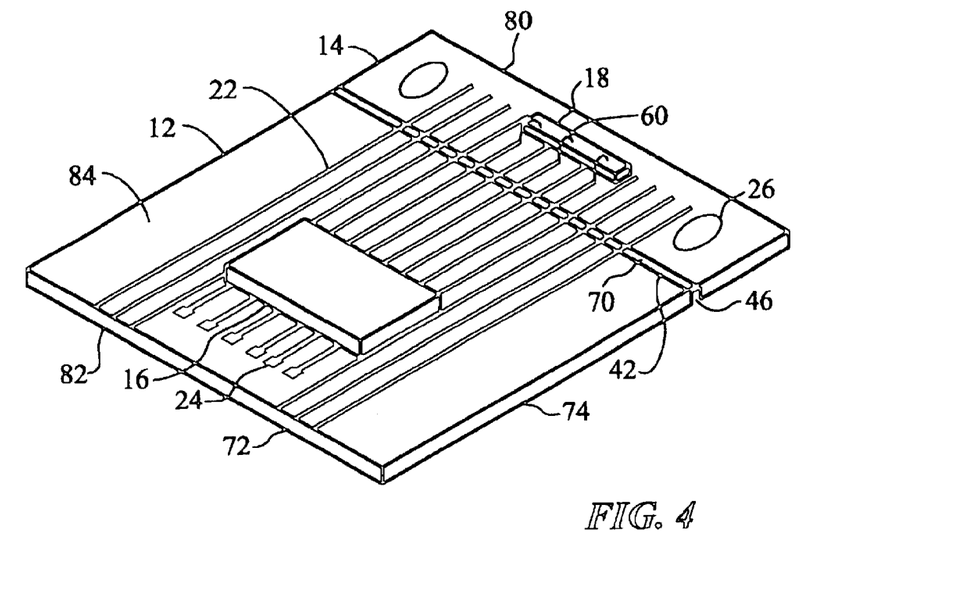
FIG. 4 illustrates a perspective view of an optically transparent substrate with electrical traces traversing over a hinge on the substrate.
Figure 5:
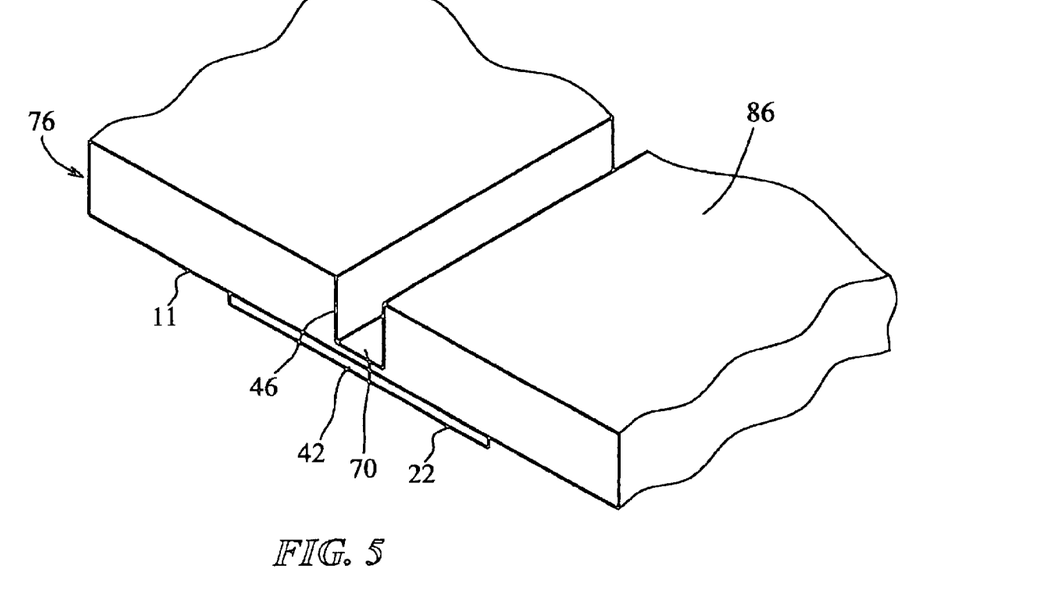
FIG. 5 illustrates an enlarged perspective view of a removed portion of the substrate.
Figure 7A:
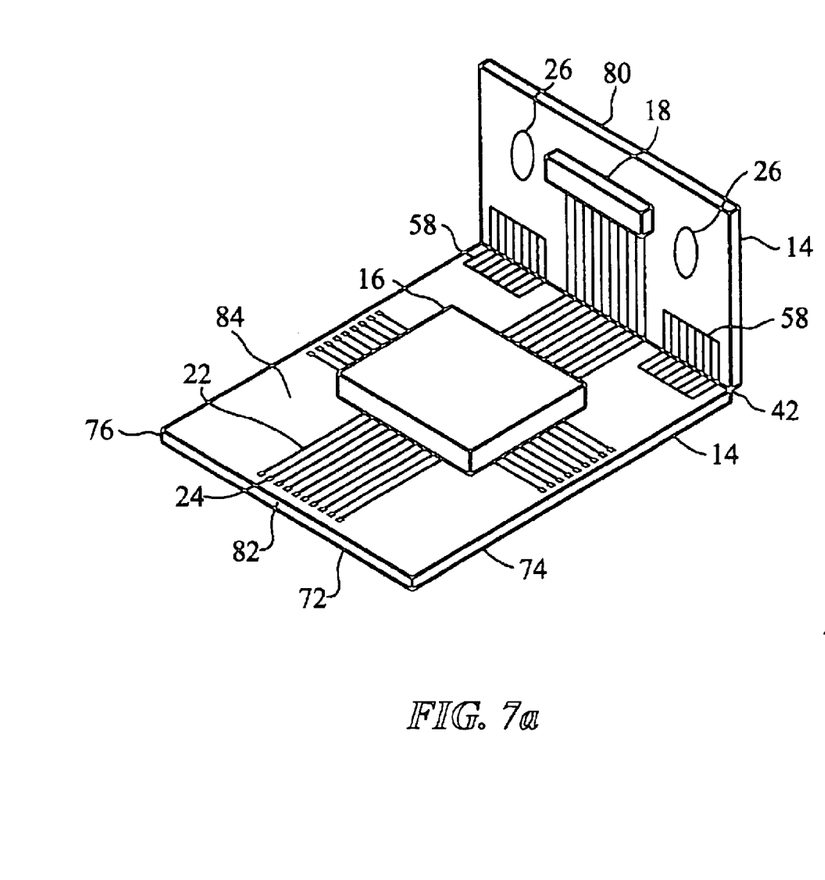
FIG. 7a illustrates a perspective view of a bent substrate with corresponding components, features, and traces on the substrate.
Figure 7B:
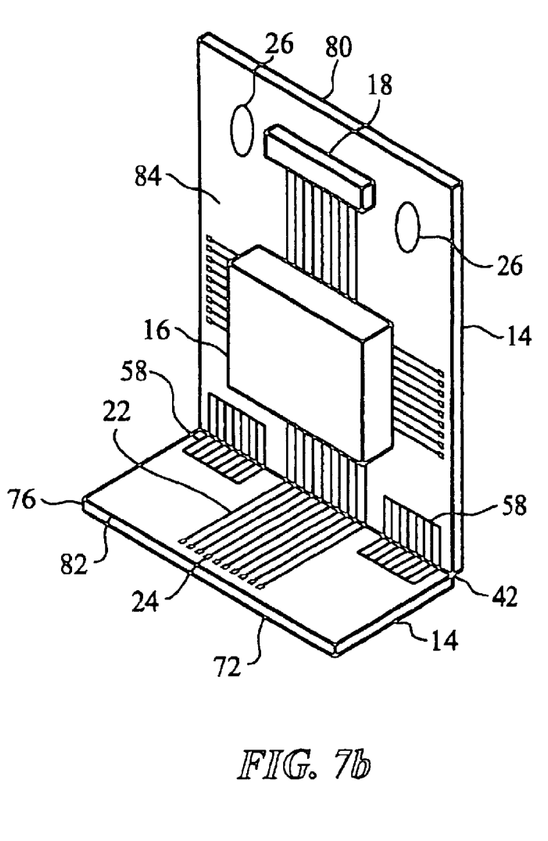
FIG. 7b illustrates a perspective view of a bent substrate with the hinge in a different location.

As shown in FIGS. 1, 7a, and 7b, the substrate 11 may have a 90 degree bend to allow optical signals to travel parallel to the PCB 20. As illustrated in FIGS. 4, 5, 7a, and 7b the 90 degree bend in the substrate 11 may be formed by breaking the substrate along a groove 46 and rotating a portion of the substrate 11 about the groove 46. After breaking, the substrate 11 may then become a two-member body, having relatively rigid planar elements 12 and 14. The groove 46, shown in the greatly enlarged underside cut-a-way view of FIG. 5, may be formed on the second surface 86 of the substrate 11, along the width 72 of the substrate 11, and at any location along the length 74 of the substrate 11. The groove 46 could be formed using a conventional laser ablation, laser scribing, or mechanical scribing process. The groove 46 may traverse the width 72 while not extending through the thickness 76 of the substrate 11, as illustrated in FIG. 5 (i.e., about 90% through the thickness). If the groove 46 is formed completely through the thickness 76 of the substrate, the electrical traces 22 could be damaged or separated. The broken substrate 11 with first and second planar elements 12 and 14 may have an abutting common edge 70, as shown in FIG. 4. Upon forming the groove 46 partially through the substrate 11, the grooved substrate 11 could be placed in a mechanical fixture that could break the substrate 11 by rotating a planar element 12 or 14 about the groove 46 with respect to the other planar element.

The first and second planar elements 12, 14 may be rotated to any position with respect to the common edge 70. Once rotated, the first and second planar elements 12, 14 may lie at differing angles with respect to each other about the common edge 70 (e.g., the planar elements may form an angle of 90 degrees on one side and 270 degrees on the other side).

Conductive traces 22 may traverse the substrate 11 (i.e., connect the two halves 12, 14 of the substrate 11) and may structurally and electrically interconnect the two planar elements. The conductive traces 22 traversing the two planar elements may form a hinge 42 extending the width 72 of the substrate 11 (the hinge 42 being located along the common edge 70). The second planar element 14 may be rotated along the hinge 42 to any desired angle 88. In a preferred embodiment of the present invention, the second planar element 14 may be rotated ninety degrees, forming a ninety-degree angle with the substrate's first planar element 12. Rotating of the substrate to a desired angle 88 could complete the process of breaking the substrate 11 into two sections 12 and 14. That is, the planar substrate 11 could be broken and rotated to a desired angle 88 by necessarily rotating the second planar element 14 of the substrate 11 about the hinge 42, thus eliminating the specific manufacturing process of breaking the substrate 11. Rotating the second planar element 14 of the substrate 11 allows the transmission axis 32 and 34 of the optical array 18 to be aligned parallel to the first planar element 12 of the substrate 11, further promoting planarity and thus manufacturability.

Figure 6:
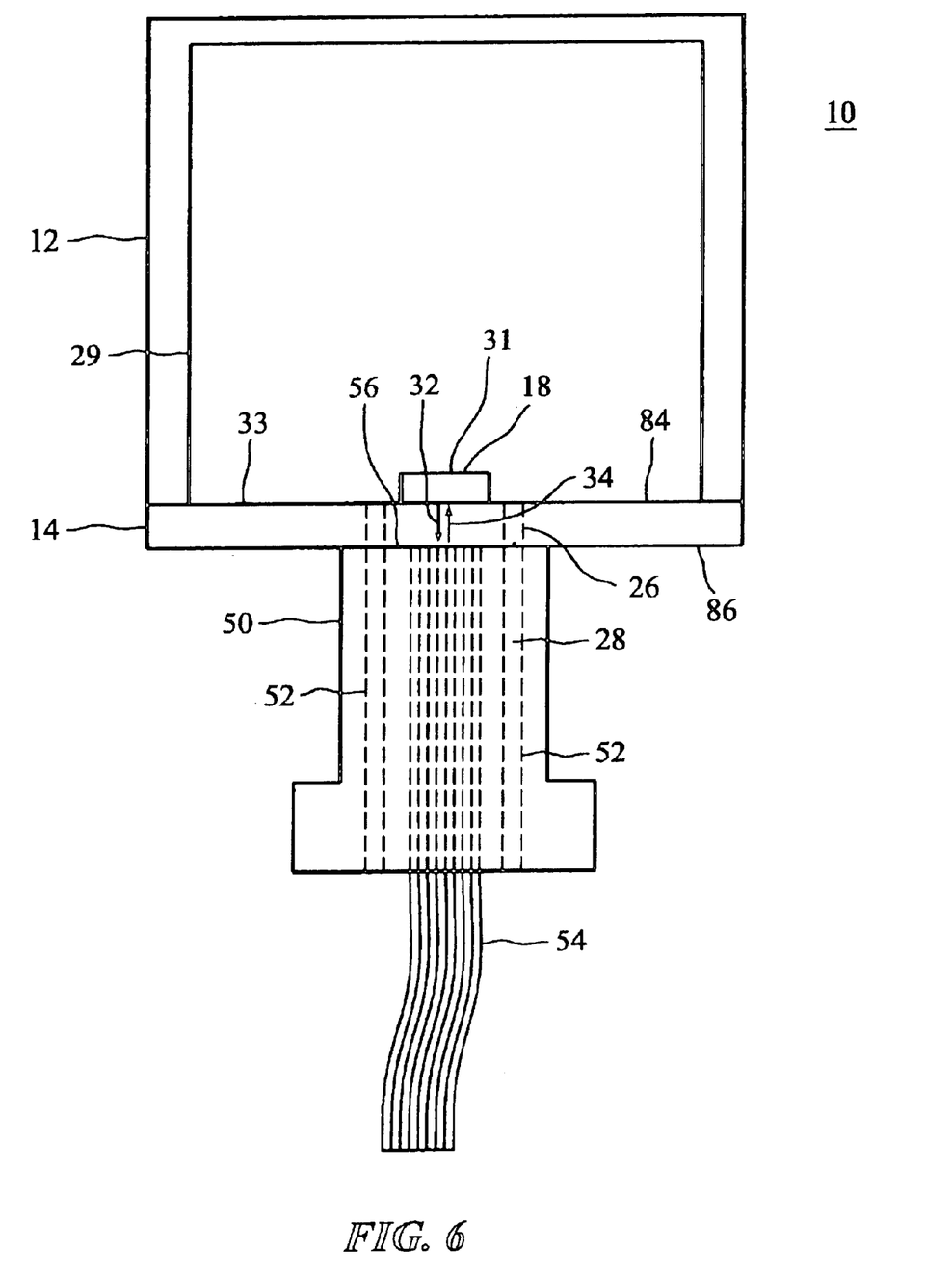
FIG. 6 illustrates a top view of an electro-optic communication system.

FIG. 6 is a top view illustrating the mating of the second surface 86 of the second planar element 14 of the substrate 11 with the first surface 56 of the optical fiber holder 50. The alignment pins 28 may be inserted through the alignment apertures 52 of the fiber holder 50. As shown in FIGS. 1 and 6, the alignment pin holder 29 may restrict rotation 88 of the second planar element 14 about the hinge 42. The pin holder 29 and the first surface 84 of the second planar element 14 may then be mechanically attached by an adhesive 62 or similar material, once the desired angle of rotation 88 is achieved. The alignment pin holder 29 may also contain a removed section 31 located proximate the optical array 18. The removed section 31 may prevent the pin holder 29 from coming in contact with and hence exerting a force on the optical array 18 and possibly causing damage. Thus, the section 33 of the pin holder 29 without a removed section 31 may then come in contact with the first surface 84 of the second planar element 14 of the substrate 11. The first surface 56 of the optical fiber holder 50 may be coincident with the second surface 86 of the second planar element 14 of the substrate 11, as shown in FIG. 6. Optical signals 32 and 34 passing directly through the second planar element 14 of the substrate 11 would form an optical interface of light transmission.

ALTERNATIVE EMBODIMENTS OF THE INVENTION

As previously stated, the substrate's break region or hinge 42 could be located at any location along the length 74 of the substrate. In a preferred embodiment of the invention the groove 46 on the substrate 11 would be located between the optical array 18 and the electrical IC 16 on the second surface 86 of the substrate 11. In an additional embodiment of the invention shown in FIG. 7b, the groove 46 and corresponding hinge 42 could be located on the substrate 11 between a second edge 82 and the electrical IC 16.

In another embodiment of the invention, the bending of the substrate 11 could be performed by using a heated wire bending process, thus eliminating the laser ablation process. The substrate 11 could be placed in a mechanical fixture that would heat a portion of the substrate 11 using a thin, hot wire. The temperature of the substrate 11 would rise appropriately to facilitate the bending of the substrate 11. The substrate 11 would not have a break region, but would have a hinge 42 as stated before.

Figure 8A:
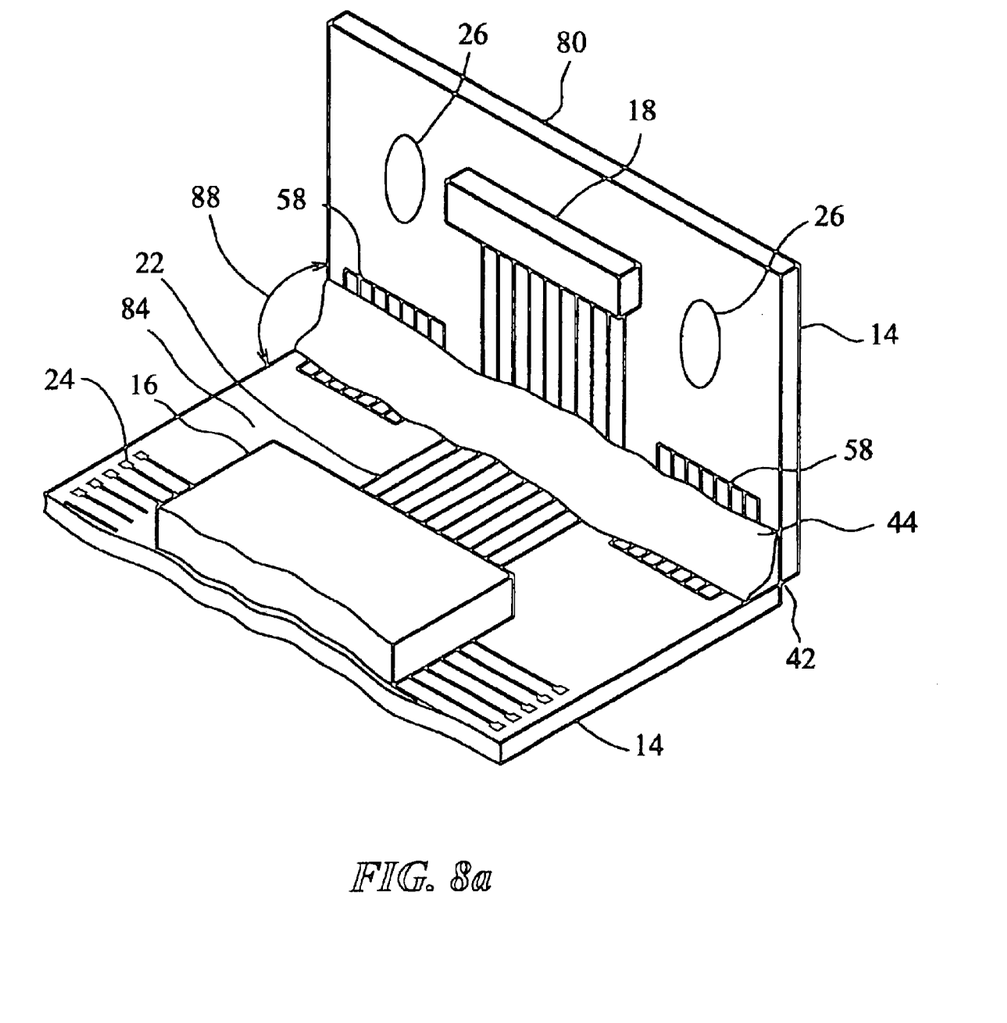
FIG. 8a is a broken perspective view of a structural material creating a flexible interconnect region, in an alternate embodiment of the invention.
Figure 8B:
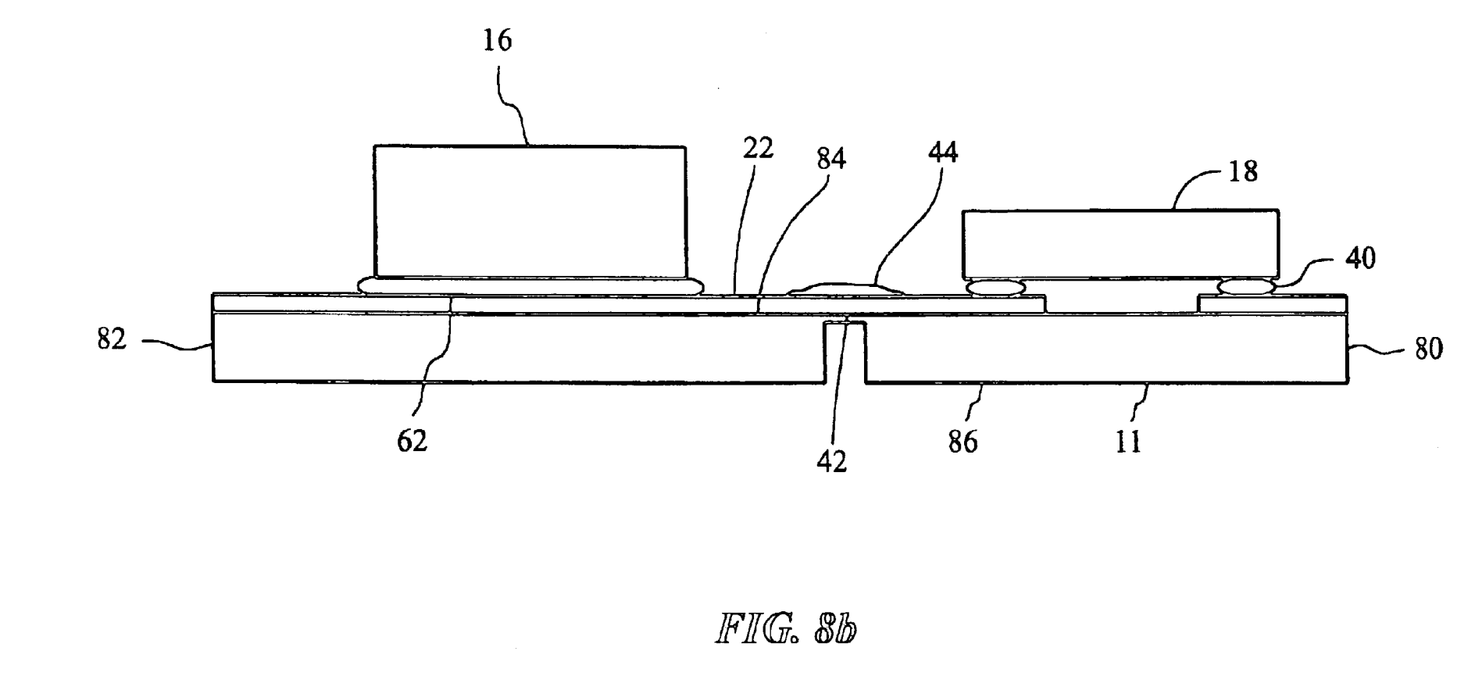
FIG. 8b is a side view of a structural material creating a flexible interconnect region, in an alternate embodiment of the invention.

FIG. 8a and FIG. 8b show a thin, structural material 44 that could be disposed on the hinge 42 of the substrate 11, on the first surface 84, in an alternate embodiment of the invention. This material could be placed on the hinge whether a heated wire or laser ablation process is used to bend the substrate 11. The material could comprise a flexible insulative material such as a polyimide. Common trade names for polyimide are "KAPTON" and "UPLEX." The material 44 could form a layer over the electrical traces 22, 58 on the hinge 42.

Additional traces 58 could be placed on the substrate as shown in FIGS. 4, 7a, 7b, and 8a. The traces could be formed using conventional photolithography etching techniques, or a similar process. The traces could provide mechanical strength in supporting the second planar element 14 of the substrate 14 in the desired angular position 88.

An additional mechanical strength (not shown) layer could be deposited over the metal traces, bonding to both the first layer of polyimide 44 and the traces 22 and 58, thus creating a flex interconnect region. Additional metal traces (not shown) could traverse over this flex region to provide additional mechanical interconnection or to provide a ground plane. The flexible, structural material 44 could be applied before the substrate 11 is broken and rotated by a liquid deposition process. The thin layer 44 could be formed by using a spinning and screen-printing process.

While a specific embodiment of the invention has been shown and described, further modifications and improvements will occur to those skilled in the art. This invention, therefore, is not limited to the particular forms shown, and the appended claims cover all modifications that do not depart from the spirit and scope of this invention.

What is claimed is:

1. A method for providing an electro-optic signal processing assembly, such method comprising the steps of:

providing an optically transparent substrate with a plurality of alignment apertures formed in the substrate;

disposing a guide pin in each of the plurality of alignment apertures;

disposing a signal processor on the substrate disposing an optical device on the substrate in alignment with the plurality of alignment apertures with a transmission path of the optical device passing directly through the body of the optically transparent substrate;

aligning an optical fiber holder to the optical device using the guide pins and guide pin apertures;

coupling an optical signal of the optical device to a respective optical fiber of the aligned optical fiber holder.

2. The method for providing an electro-optic signal processing device as in claim 1 further comprising defining the signal processor as an amplifier.

3. The method for providing an electro-optic signal processing device as in claim 2 further comprising the optically transparent substrate having first and second planar elements with an abutting common edge, the planar elements lying at differing angles with respect to each other about the common edge.

4. The method for providing an electro-optic signal processing device as in claim 3 further comprising disposing conductive traces on a first surface of the substrate traversing both planar elements of the substrate.

5. The method for providing an electro-optic signal processing device as in claim 4 further comprising coupling the optical device and amplifier with at least some of the conductive traces traversing both planar elements of the substrate.

6. The method for providing an electro-optic signal processing device as in claim 5 further comprising the amplifier on the substrate amplifying a driving signal of a laser of the optical device.

7. The method for providing an electro-optic signal processing device as in claim 6 further comprising the amplifier on the optically transparent substrate amplifying a signal from a photodetector of the optical device.

8. The method for providing an electro-optic signal processing device as in claim 5 further including providing an etched groove disposed on a second surface of the substrate, and forming the substrate into an L-shaped bracket defined by the first and second planar elements along the etched groove.

9. The method for providing an electro-optic signal processing device as in claim 8 further comprising interconnecting the first and second planar elements of the substrate with a flexible hinge formed from the at least some of the conductive traces disposed on the first surface of the substrate.

10. The method for providing an electro-optic signal processing device as in claim 9 further including disposing a flexible material on the first surface of the substrate across the interconnecting hinge.

11. The method for providing an electro-optic signal processing device as in claim 10 further comprising defining the flexible material disposed on the first surface of the substrate as a layer of polyimide disposed across the interconnecting hinge connecting the first and second planar elements.

12. An electro-optic signal processing device comprising:

an optically transparent substrate having alignment apertures formed in the substrate;

a signal processor disposed on the substrate;

an optical device disposed on the optically transparent substrate in alignment with the alignment apertures, said optical device having a transmission path that passes directly through the body of the optically transparent substrate, and means for holding an optical fiber and for guiding the optical device into alignment with a respective optical fiber using the alignment apertures.

13. The electro-optic signal processing device as in claim 12 wherein the signal processor further comprises an amplifier.

14. The electro-optic signal processing device as in claim 13 further comprising first and second planar elements of the optically transparent substrate, with the planar elements lying at differing angles and having an abutting common edge.

15. The electro-optic signal processing device as in claim 14 further comprising conductive traces traversing both planar elements of the substrate.

16. The electro-optic signal processing device as in claim 15 wherein at least some of the conductive traces traversing the planar elements of the substrate further comprise an electrical coupling between the optical device and the amplifier.

17. The electro-optic signal processing device as in claim 16 further comprising the amplifier on the substrate connected to amplify a driving signal of a laser of the optical device.

18. The electro-optic signal processing device as in claim 17 further comprising the amplifier on the optically transparent substrate connected to amplify a signal from a photodetector of the optical device.

19. The electro-optic signal processing device as in claim 16 further comprising an etched groove disposed on the second surface of the substrate, and the substrate formed into an L-shaped bracket defined by the first and second planar elements on respective sides of the etched groove.

20. The electro-optic signal processing device as in claim 19 wherein at least some of the conductive traces disposed on the first surface of the substrate interconnect the first and second planar elements of the substrate, forming an interconnect hinge.

21. The electro-optic signal processing device as in claim 20 further including a flexible material disposed on the first surface of the substrate substantially proximate the interconnect hinge.

22. The electro-optic signal processing device as in claim 21 wherein the flexible material disposed on the first surface of the substrate substantially proximate the interconnect hinge further comprises attaching a layer of polyimide across the interconnect hinge to the first and second planar elements.

* * * * *